US010410827B2

(12) United States Patent
Mohammadi-Gheidari et al.

(10) Patent No.: US 10,410,827 B2
(45) Date of Patent: Sep. 10, 2019

(54) GUN LENS DESIGN IN A CHARGED PARTICLE MICROSCOPE

(71) Applicant: FEI Company, Hillsboro, OR (US)

(72) Inventors: Ali Mohammadi-Gheidari, Best (NL); Alexander Henstra, Utrecht (NL); Peter Christiaan Tiemeijer, Eindhoven (NL); Kun Liu, Beaverton, OR (US); Pleun Dona, Veldhoven (NL); Gregory A. Schwind, Portland, OR (US); Gerbert Jeroen van de Water, Breugel (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/586,194

(22) Filed: May 3, 2017

(65) Prior Publication Data

US 2018/0323036 A1 Nov. 8, 2018

(51) Int. Cl.
| | |
|---|---|
| *H01J 37/29* | (2006.01) |
| *H01J 37/065* | (2006.01) |
| *H01J 37/067* | (2006.01) |
| *H01J 37/145* | (2006.01) |
| *G02B 21/06* | (2006.01) |
| *H01J 37/244* | (2006.01) |

(52) U.S. Cl.
CPC .......... *H01J 37/29* (2013.01); *G02B 21/06* (2013.01); *H01J 37/065* (2013.01); *H01J 37/067* (2013.01); *H01J 37/145* (2013.01); *H01J 37/244* (2013.01); *H01J 2237/0656* (2013.01); *H01J 2237/06316* (2013.01); *H01J 2237/06341* (2013.01); *H01J 2237/08* (2013.01); *H01J 2237/1415* (2013.01); *H01J 2237/28* (2013.01)

(58) Field of Classification Search
USPC ........................................................ 250/310
See application file for complete search history.

(56) References Cited

U.S. PATENT DOCUMENTS

| | | | | |
|---|---|---|---|---|
| 2,926,254 | A * | 2/1960 | Haine | H01J 37/153 |
| | | | | 250/396 R |
| 5,371,371 | A | 12/1994 | Yamazaki et al. | |
| 5,548,183 | A * | 8/1996 | Miyoshi | H01J 37/065 |
| | | | | 313/153 |
| 6,693,282 | B1 | 2/2004 | Tiemeijer | |
| 7,064,325 | B2 * | 6/2006 | Buijsse | H01J 37/143 |
| | | | | 250/309 |

(Continued)

FOREIGN PATENT DOCUMENTS

JP 2006324119 A 11/2006

OTHER PUBLICATIONS

"Electron Microscope", Wikipedia, Retrieved from the Internet Oct. 15, 2015, http://en.wikipedia.org/wiki/Electron_microscope, 11 pages.

(Continued)

*Primary Examiner* — Phillip A Johnston

(57) ABSTRACT

A charged particle microscope and a method of operating a charged particle microscope are disclosed. The microscope employs a source for producing charged particles, and a source lens below the source to form a charged particle beam which is directed onto a specimen by a condenser system. A detector collects radiation emanating from the specimen in response to irradiation of the specimen by the beam. The source lens is a compound lens, focusing the beam within a vacuum enclosure using both a magnetic lens having permanent magnets outside the enclosure to produce a magnetic field at the beam, and a variable electrostatic lens within the enclosure.

15 Claims, 2 Drawing Sheets

(56) References Cited

U.S. PATENT DOCUMENTS

Figure 1:
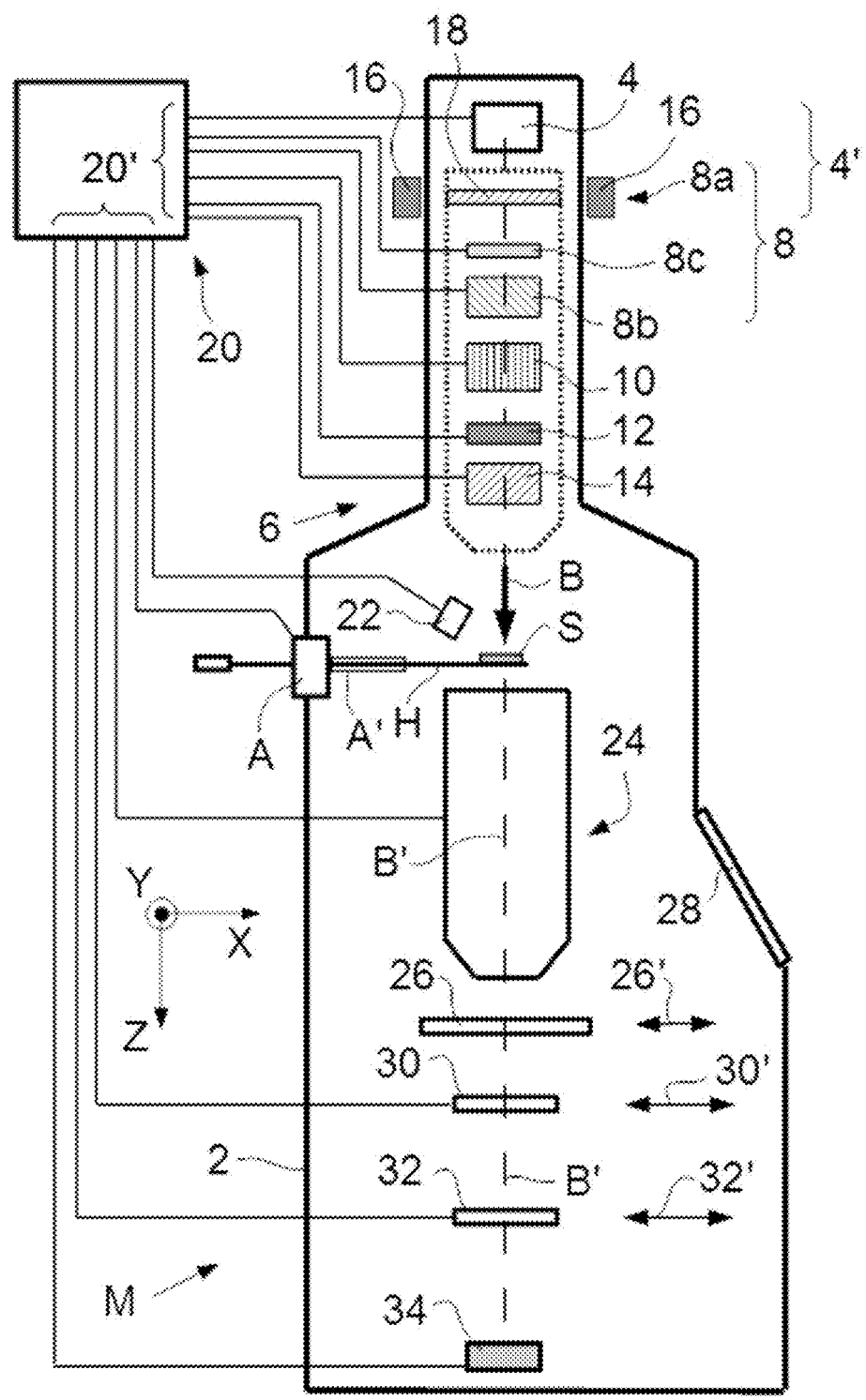

| | | | |
|---|---|---|---|
| 7,446,320 B1* | 11/2008 | McCord | H01J 37/12 |
| | | | 250/396 R |
| 7,888,654 B2* | 2/2011 | Tessner, II | H01J 1/3044 |
| | | | 250/305 |
| 8,736,170 B1 | 5/2014 | Liu et al. | |
| 9,425,022 B2* | 8/2016 | Ogawa | H01J 37/12 |
| 2004/0211914 A1 | 10/2004 | Buijsse | |
| 2005/0178982 A1 | 8/2005 | Henstra et al. | |
| 2005/0236568 A1 | 10/2005 | Buijsse et al. | |
| 2006/0175548 A1 | 8/2006 | Kawasaki et al. | |
| 2006/0197030 A1 | 9/2006 | Buijsse et al. | |
| 2008/0174225 A1 | 7/2008 | Tessner et al. | |
| 2009/0289195 A1 | 11/2009 | Henstra | |
| 2011/0101238 A1 | 5/2011 | Theodore et al. | |
| 2011/0284763 A1 | 11/2011 | Henstra | |
| 2012/0112090 A1 | 5/2012 | Henstra | |
| 2013/0187058 A1 | 7/2013 | Swanson et al. | |
| 2015/0371811 A1 | 12/2015 | Ogawa et al. | |

OTHER PUBLICATIONS

"Electrostatic Lens", Wikipedia, Retrieved from the Internet Aug. 18, 2017, http://en.wikipedia.org/wiki/Electrostatic_lens, 4 pages.

"Focused Ion Beam", Wikipedia, Retrieved from the Internet Jul. 11, 2016, https://en.wikipedia.org/wiki/Focused_ion_beam, 7 pages.

"Liquid Metal Ion Source", Wikipedia, Retrieved from the Internet Aug. 18, 2017, http://en.wikipedia.org/wiki/Liquid_metal_ion_source, 2 pages.

"Magnetic Lens", Wikipedia, Retrieved from the Internet Aug. 18, 2017, http://en.wikipedia.org/wiki/Magnetic_lens, 3 pages.

"Scanning Electron Microscope", Wikipedia. Retrieved from the Internet Jul. 25, 2016, http://en.wikipedia.org/wiki/Scanning_electron_microscope, 23 pages.

"Scanning Helium Ion Microscope", Wikipedia, Retrieved from the Internet on Jul. 25, 2016, http://en.wikipedia.org/wiki/Scanning_Helium_Ion_Microscope, 2 pages.

"Scanning Transmission Electron Microscopy", Wikipedia, Retrieved from the Internet Jul. 25, 2016, http://en.wikipedia.org/wiki/Scanning_transmission_ electron_ microscopy, 5 pages.

"Transmission Electron Microscopy", Wikipedia, Retrieved from the Internet Jul. 25, 2016, http://en.wikipedia.org/wiki/Transmission_electron_microscopy, 23 pages.

Escovitz, W.H. et al., "Scanning Transmission Ion Microscope with a Field Ion Source," Proc. Nat. Acad. Sci. USA, May 1975, pp. 1826-1828, vol. 72, No. 5.

Varentsov, D. et al. "First biological images with high-energy proton microscopy", Physica Medica (2013), pp. 208-213, vol. 29.

* cited by examiner

GUN LENS DESIGN IN A CHARGED PARTICLE MICROSCOPE

The invention relates to a charged particle microscope comprising:
- A vacuum enclosure;
- A source, for producing a beam of charged particles;
- A specimen holder, for holding a specimen;
- An illuminator, provided between said source and specimen holder, and comprising in a propagation direction of said beam:
  - A source lens;
  - A condenser system;
- A detector, for detecting radiation emanating from the specimen in response to irradiation by said beam.

The invention also relates to a method of using such a charged particle microscope.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
- en.wikipedia.org/wiki/Electron microscope
- en.wikipedia.org/wiki/Scanning electron microscope
- en.wikipedia.org/wiki/Transmission electron microscopy
- en.wikipedia.org/wiki/Scanning transmission electron microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
- en.wikipedia.org/wiki/Focused ion beam
- en.wikipedia.org/wiki/Scanning Helium Ion Microscope
- W. H. Escovitz, T. R. Fox and R. Levi-Setti, *Scanning Transmission Ion Microscope with a Field Ion Source*, Proc. Nat. Acad. Sci. USA 72(5), pp. 1826-1828 (1975).
- www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:
- A particle source, such as a Schottky electron source or ion source.
- An illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder will comprise means for maintaining said specimen at cryogenic temperatures, e.g. using an appropriately connected cryogen vat.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the particular case of a dual-beam microscope, there will be (at least) two sources/illuminators (particle-optical columns), for producing two different species of charged particle. Commonly, an electron column (arranged vertically) will be used to image the specimen, and an ion column (arranged at an angle) can be used to (concurrently) modify (machine/process) and/or image the specimen, whereby the specimen holder can be positioned in multiple degrees of freedom so as to suitably "present" a surface of the specimen to the employed electron/ion beams.

In the case of a transmission-type microscope (such as a (S)TEM, for example), a CPM will specifically comprise:
- An imaging system (imaging particle-optical column), which essentially takes charged particles that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

With reference to the opening paragraph above, the illuminator in the present situation comprises:

A condenser system, which essentially serves to define a footprint/illumination state of the beam as it impinges upon the specimen, e.g. the size/shape of a focused "probe" into which the beam is focused, the area/cross-sectional shape of a collimated beam directed at the specimen, etc.

A source lens ("gun lens"), which essentially serves as a post-source beam conditioner (positioned proximal/immediately downstream of the source), serving inter alia to effect magnification/collimation of the beam shortly/immediately after production by the source, e.g. so as to reduce the potential effect of source vibrations/curtail the beam opening angle.

In what follows, the invention may—by way of example—sometimes be set forth in the specific context of electron microscopy; however, such simplification is intended solely for clarity/illustrative purposes, and should not be interpreted as limiting.

A charged particle microscope, such as a SEM or STEM, preferably employs a high brightness source. In the case of electrons, one such source is a Cold Field Emission source (also referred to as a Cold Field Emission Gun or CFEG). For such a source, the source size and angular current density are very small, but the brightness is very high, and since the source is operated at room temperature (or a temperature close thereto) minimal thermal energy spread is introduced. A similar source producing ions is a Liquid Metal Ion Source (LMIS), for example.

The angular current density of a CFEG presents a challenge, in that it is about two orders of magnitude smaller than that of a conventional Schottky FEG, for example. This means that, for a given beam current, the solid angle focused by the employed source lens (gun lens) must be ca. two orders of magnitude larger for a CFEG than for a Schottky FEG. Therefore, in an existing CPM design, replacing a Schottky FEG (or other relatively large source) by a CFEG (or other relatively small source) is not a straightforward task, since the source lens in the existing design will generally be incompatible with the new source. On the other hand, ab initio overhauling the existing design to match the new source is generally a very unattractive option, because of the (typically) large amount of effort required to conceive, optimize and execute any CPM design. This is particularly the case in situations in which the CPM design includes a monochromator in/upstream of the condenser system, since such a monochromator tends to complicate the design and reduce the available space/optical options for a re-design.

It is an object of the invention to address this issue. More specifically, it is an object of the invention to provide a CPM architecture in which a relatively small source (such as a CFEG) can be satisfactorily combined with a basic particle-optical design that was/is intended for a larger source (such as a Schottky FEG). In particular, it is an object of the invention that such a CPM architecture should lend itself to source replacement/swopping by a different size/type of source, without involving major illuminator re-design.

These and other objects are achieved in a CPM as set forth in the opening paragraph above, characterized in that said source lens is a compound lens, comprising (in said propagation direction):

A magnetic lens, comprising permanent-magnetic pole pieces that are disposed outside said vacuum enclosure but produce a magnetic field within it;

A variable electrostatic lens.

The inventive design essentially bifurcates the functionality of the source lens into two different aspects, as follows:

A "main" (lower) portion, comprising a relatively large, variable electrostatic lens that is essentially matched to/designed for the condenser system that follows it.

An "ancillary" (upper portion), comprising a relatively small, permanent-magnetic lens ("mini-lens") that is essentially matched to/designed for the source that precedes it.

Functionally speaking, said ancillary portion basically serves to "translate" the geometry/properties of a given (small) source into a form that is essentially "standardized" to/optimized for the ensuing main portion. Put another way, the ancillary portion acts as a sort of adapter between the (new) source and an (existing) illuminator design: if the source type/size is changed, it is then a relatively simple task to concurrently replace the ancillary source lens by a different one (optimized to the new source), whilst leaving the main source lens (and the optics that follow it) unchanged.

In the invention, the ancillary/upper source lens is of the aforementioned permanent-magnetic design inter alia for the following reasons:

A permanent-magnetic lens is intrinsically advantageous in that:
  It produces relatively low aberrations. This is an important point since, when using a small-emission-area source (such as a CFEG), aberrations arising from the source lens will generally be much more significant than aberrations arising from (for example) the condenser system. This is because the source lens for such a source will typically have a focal length (e.g. 1-2 mm) of the order of 10 times smaller than that of said condenser system (e.g. 10-20 mm), with a respective capture angle that is of the order of 10 times larger: accordingly, aberrations arising from the source lens will tend to be about an order of magnitude larger than those arising from the condenser system. It is therefore important to choose a source lens implementation with reduced intrinsic susceptibility to aberrations.
  A permanent-magnetic implementation obviates the need to use pre-acceleration field-generating coils at high voltage, e.g. 100 kV-1000 kV. In order to operate such coils, substantial electrical power and water cooling would be required, which are difficult to supply at such a high voltage level. Since available space in the vicinity of the source is limited, not having to work with bulky high voltage/liquid coolant apparatus in a cramped volume is of great advantage.

It is important to maintain a relatively high vacuum in the immediate vicinity of the source, so as to prevent contamination issues—which, in the case of a small source such as a (C)FEG, can cause substantial fluctuations in source output. The present invention locates the permanent magnets that generate the magnetic field for the lens ex vacuo, so as to prevent outgassing issues with the (sintered) material from which the permanent magnets are made (such as samarium-cobalt (SmCo) or neodymium-iron-boron (NdFeB) alloys).

On the other hand, the main/lower source lens is of a variable electrostatic design because such an implementation (which, again, does not specifically require cooling) is easily adjustable in terms of its focusing power (refractive power).

Some basic information on magnetic and electrostatic lenses can be gleaned from the following references:
en.wikipedia.org/wiki/Magnetic lens
en.wikipedia.org/wiki/Electrostatic lens In an advantageous embodiment of the invention, an aligning beam deflector is provided between the two components of the compound source lens, i.e. between said ancillary/upper magnetic lens and said main/lower electrostatic lens. Such a deflector/set of deflectors allows adjustment/proper alignment of the beam position before it enters the main/lower source lens, to allow for possible beam position errors caused (for example) by sub-optimal manufacturing/placement tolerances in/of the ancillary/upper source lens or source. Moreover, it allows small longitudinal/axial adjustments in focal position to be made if, for example, one adjusts the beam potential in the ancillary/upper magnetic lens, thereby causing a slight focal length variation.

In a particular embodiment of the invention, a monochromator is provided between the source lens and condenser system. Such an implementation allows effects of chromatic aberration to be reduced, with an attendant increase in attainable resolution (e.g. of the order of 0.05 nm). It also allows greater accuracy to be achieved in EELS, for example, by improving the energy purity of the input beam (prior to interaction with the specimen), leading to less "noise" in the detected signal from the output beams (after interaction with the specimen). Incorporation of a monochromator in this way complicates the optical design of the microscope; however, this does not have to be an issue since, as alluded to above, the present invention facilitates source swopping without having to do a major re-design of the (lower) illuminator (including monochromator).

In a specific embodiment of the invention, the ancillary/upper magnetic lens of the compound source lens comprises a magnetic yoke, provided at least partially within said vacuum enclosure, and comprising one or more components of said source. As already alluded to above, the various sub-components of a CPM are generally cramped together in a limited volume, so that there is great incentive to use space efficiently. The present invention allows the use of dedicated pole pieces in the aforementioned ancillary/upper magnetic lens, so as to guide magnetic field lines from the aforementioned permanent magnets (ex vacuo) and direct them into the vicinity of the beam (in vacuo); however, as an alternative/supplement, the present embodiment uses components that are already present in the source to (at least partially) achieve such pole piece functionality. To this end, such components can be configured to comprise a suitable (ferro) magnetic material, such as NiFe, for example. To give examples:

If the source comprises an extractor electrode—which is held at a high attractive potential so as to draw charged particles from a pointed emitter (e.g. as in the case of a CFEG)—then such an electrode can be configured to play the role of a first pole piece (e.g. lower pole piece) of the inventive magnetic source lens.

If the source comprises a confinement electrode—which is positioned so as to spatially confine emissions from a source emitter (e.g. as in the case of a Schottky FEG) and/or to spatially curtail migration of contaminants from the source emitter (e.g. as set forth for a CFEG in U.S. Pat. No. 8,736,170, assigned to the present assignee and incorporated herein by reference)—then such an electrode can be configured to play the role of a second pole piece (e.g. upper pole piece) of the inventive magnetic source lens.

To give a specific (non-limiting) example with reference to FIG. 5 of said U.S. Pat. No. 8,736,170:
Extractor electrode 508 can act as a first (lower/forward) pole piece; and/or
Enclosure electrode 552 can act as a second (upper/rear) pole piece,
if the electrodes in question are configured to comprise ferromagnetic material.

As already referred to above, the present invention is particularly advantageous when the employed source is a CFEG. However, this is not the only type of source that can be used with the invention, and other source types include, for example, an Electron Impact Ionization Source (EIIS) [of which a particular form is a Nano Aperture Ion Source (NAIS)], a Liquid Metal Ion Source (LMIS) [already alluded to above], and a field ionization source. For more information on EIIS/NAIS sources, see, for example, co-pending U.S. applications Ser. No. 15/405,139 (filed Mar. 12, 2017) and Ser. No. 15/422,454 (filed Feb. 1, 2017), both of which are assigned to the assignee of the present application, and are incorporated herein by reference. For more information on LMIS sources, see, for example, the following Wikipedia reference:
en.wikipedia.org/wiki/Liquid metal ion source As already alluded to above, the "bifurcation" of functionality designed into the source lens of the present invention allows a source swapping operation comprising:
Removing from the microscope a first assembly, which comprises a first source and one of:
A first implementation of said magnetic lens;
No magnetic lens;
Replacing said removed first assembly by a second assembly, which comprises a second source and a second implementation of said magnetic lens,
while leaving said variable electrostatic lens in place. What essentially applies here is that the ancillary/upper magnetic source lens is regarded as an item to be co-replaced with the source, whereby a given source and its associated upper/ancillary magnetic lens are "matched" to one another, and as an assembly are also seamlessly matched to the lower/main electrostatic source lens—which, for this reason, is essentially "oblivious" to the particular source/upper source lens installed above it.

The skilled artisan will appreciate that the present invention can be applied in a TEM, STEM, SEM, FIB-SEM, and various other types of CPM.

The invention will now be elucidated in more detail on the basis of exemplary embodiments and the accompanying schematic drawings, in which:

FIG. 1 renders a longitudinal cross-sectional view of an embodiment of a CPM in which the present invention is implemented.

Figure 2:
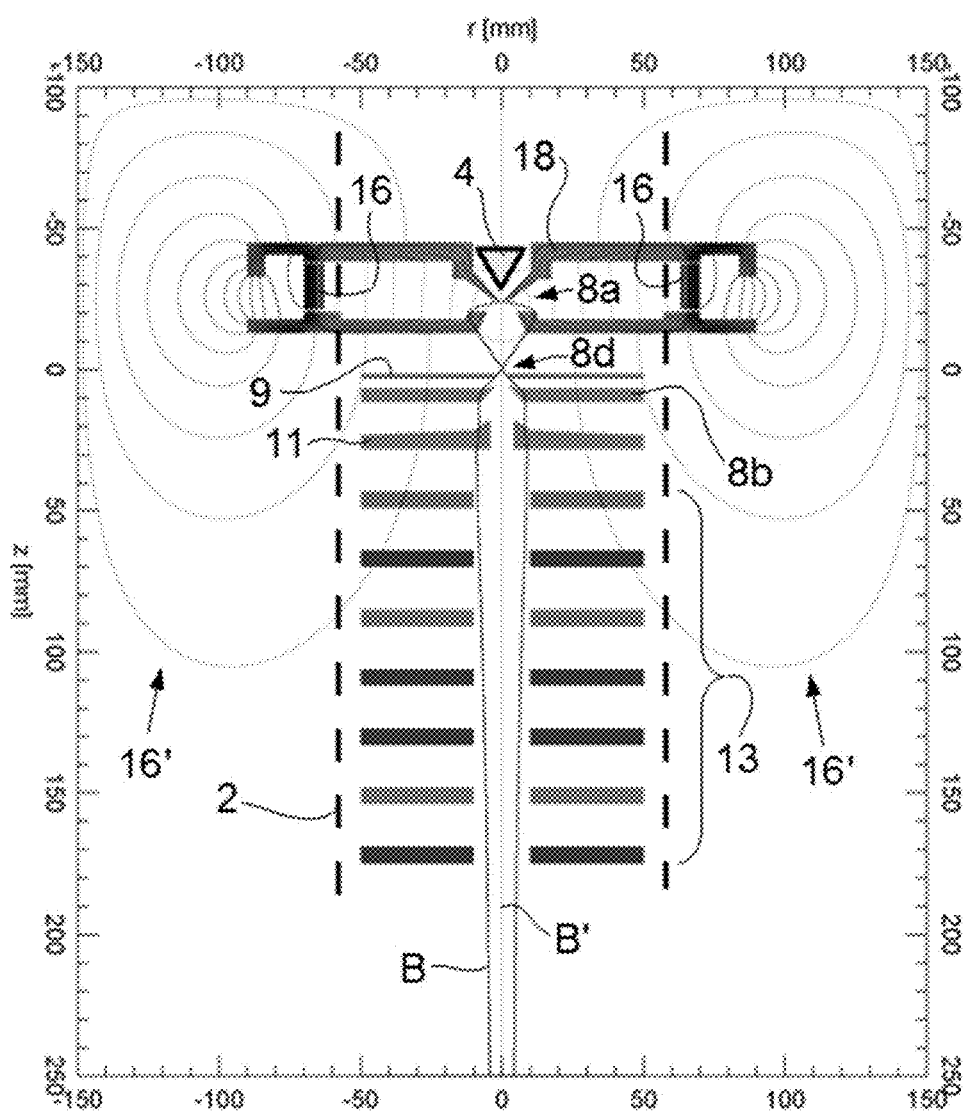

FIG. 2 shows a magnified, more detailed view of a portion of FIG. 1.

In the Figures, where pertinent, corresponding parts are indicated using corresponding reference symbols.

Embodiment 1

FIG. 1 (not to scale) is a highly schematic depiction of an embodiment of a charged-particle microscope M in which the present invention is implemented; more specifically, it shows an embodiment of a transmission-type microscope M, which, in this case, is a TEM/STEM (though, in the context of the current invention, it could just as validly be a SEM, or an ion-based microscope, for example). In the Figure, within a vacuum enclosure 2, a small-emission-area source (such as a CFEG electron source) 4 produces a beam B of electrons that propagates along an electron-optical axis B' and traverses an electron-optical illuminator 6 (schematically depicted within a broken line), serving to direct/focus the electrons onto a chosen part of a specimen S (which may, for example, be (locally) thinned/planarized). This illuminator 6 will be discussed in more detail below.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be irradiated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

In the particular context of the present invention, the illuminator 6 comprises (considered parallel to the propagation direction of beam B):

A source lens (gun lens) 8;
A condenser system 10.

As here configured, the illuminator 6 additionally comprises:

A scan deflector 12;
An objective lens 14.

In accordance with the invention, the source lens 8 is a compound lens comprising:

A magnetic lens 8a (also referred to above as an ancillary/upper source lens), comprising permanent magnets 16 that are disposed outside vacuum enclosure 2 but produce a magnetic field within it. As here depicted, this magnetic field is "conducted" into the vicinity of axis B' using yoke 18, which may comprise a (ferromagnetic) material such as NiFe, for instance.

A variable electrostatic lens 8b (also referred to above as a main/lower source lens). Also depicted is an optional corrective/aligning beam deflector 8c, which is disposed between said magnetic lens 8a and electrostatic lens 8b, and serves to ensure that a beam B leaving upper item 8a is positionally adjusted for optimized entry into lower item 8b.

As already set forth above, source 4 and magnetic lens 8a may be regarded as forming an interchangeable assembly 4', which can be swapped out and replaced by a different such assembly. In such a scenario, the properties of the magnetic lens 8a can be tuned to those of the chosen source 4 in such a manner that, regardless of the particular such assembly 4' chosen, the "lower" illuminator from electrostatic lens 8b downward does not have to be specifically matched each time to each different assembly 4', but can instead maintain a constant, generic architecture/configuration.

Turning now to FIG. 2, this shows a magnified, more detailed view of a portion of the subject of FIG. 1. More particularly, it shows (to approximate scale) the following components:

- A yoke 18, and cylindrical permanent magnets 16. In this particular instance, the magnets 16 comprise Sm—Co, and the yoke comprises a NiFe alloy. In the proximity of particle-optical axis B', the yoke 18 tapers inwards, creating a relatively short-focal-length magnetic lens 8a with a focal point 8d. Note that the permanent magnets are outside the (wall of the) vacuum enclosure 2. The field lines 16' of the magnets 16 are also illustrated.
- A relatively small-emission-area (CFEG) source 4.
- An electrostatic lens 8b, which is operated at an adjustable positive potential (e.g. of the order of about 0.05-2 kV).
- An extractor 9, which is held at a positive potential of ca. 4.5 kV, for example.
- An anode 11, which is held at a positive potential of ca. 4 kV, for example.
- A series 13 of accelerating electrodes, which may be held at successively higher positive voltages, e.g. progressively ranging from about 7.5 kV to 60 kV.

The magnetic lens 8a is matched to the source 4 in such a way that the focal point 8d essentially coincides (relative to item 8b, for instance) with the position of a Schottky FEG, if one were to be used in this configuration.

The invention claimed is:

1. A charged particle microscope comprising:
   a vacuum enclosure;
   a source, for producing a beam of charged particles;
   a specimen holder, for holding a specimen;
   an illuminator, provided between said source and specimen holder, and comprising in a propagation direction of said beam:
   a source lens; and
   a condenser system; and
   a detector, for detecting radiation emanating from the specimen in response to irradiation by said beam;
   wherein said source lens is a compound lens, comprising in said propagation direction:
   a magnetic lens, comprising permanent magnets disposed outside said vacuum enclosure but producing a magnetic field within said enclosure, the magnetic lens matched to the source; and
   a variable electrostatic lens matched to the condenser system,
   wherein a combination of the magnetic lens and the variable electrostatic lens adapts the source to the illuminator.

2. The microscope according to claim 1, wherein an aligning beam deflector is provided between said magnetic lens and said electrostatic lens.

3. The microscope according to claim 1, wherein a monochromator is provided between said electrostatic lens and said condenser system.

4. The microscope according to claim 1, wherein said magnetic lens comprises a magnetic yoke, provided at least partially within said vacuum enclosure, and comprising one or more components of said source.

5. The microscope according to claim 4, wherein said source comprises an extractor electrode that is at least partially comprised in a first pole piece of said yoke.

6. The microscope according to claim 4, wherein said source comprises a confinement electrode that is at least partially comprised in a second pole piece of said yoke.

7. The charged particle microscope according to claim 1, wherein said source is selected from the group comprising a Cold Field Emitter Gun (CFEG), an electron impact ion source, a Nano Aperture Ion Source (NAIS), a Liquid Metal Ion Source (LMIS), and a field ionization source.

8. A method of operating a charged particle microscope comprising:
   providing a specimen on a specimen holder;
   using a source to produce a beam of charged particles;
   passing said beam through an illuminator, provided between said source and specimen holder, and comprising in a propagation direction of said beam:
   a source lens; and
   a condenser system;
   irradiating the specimen with the beam emerging from said illuminator;
   using a detector to detect radiation emanating from the specimen in response to said irradiation;
   wherein said source lens is a compound lens, comprising in said propagation direction:
   a magnetic lens, comprising permanent magnets disposed outside said vacuum enclosure but producing a magnetic field within said enclosure, the magnetic lens matched to the source; and
   a variable electrostatic lens matched to the condenser system,
   wherein a combination of the magnetic lens and the variable electrostatic lens adapts the source to the illuminator.

9. The microscope according to claim 2, wherein a monochromator is provided between said electrostatic lens and said condenser system.

10. The microscope according to claim 2, wherein said magnetic lens comprises a magnetic yoke, provided at least partially within said vacuum enclosure, and comprising one or more components of said source.

11. The microscope according to claim 3, wherein said magnetic lens comprises a magnetic yoke, provided at least partially within said vacuum enclosure, and comprising one or more components of said source.

12. The microscope according to claim 5, wherein said source comprises a confinement electrode that is at least partially comprised in a second pole piece of said yoke.

13. The charged particle microscope according to claim 2, wherein said source is selected from the group comprising a Cold Field Emitter Gun (CFEG), an electron impact ion source, a Nano Aperture Ion Source (NAIS), a Liquid Metal Ion Source (LMIS), and a field ionization source.

14. The charged particle microscope according to claim 3, wherein said source is selected from the group comprising a Cold Field Emitter Gun (CFEG), an electron impact ion source, a Nano Aperture Ion Source (NAIS), a Liquid Metal Ion Source (LMIS), and a field ionization source.

15. The charged particle microscope according to claim 4, wherein said source is selected from the group comprising a Cold Field Emitter Gun (CFEG), an electron impact ion source, a Nano Aperture Ion Source (NAIS), a Liquid Metal Ion Source (LMIS), and a field ionization source.

* * * * *